United States Patent
Lopatin et al.

(10) Patent No.: US 7,064,065 B2
(45) Date of Patent: Jun. 20, 2006

(54) SILVER UNDER-LAYERS FOR ELECTROLESS COBALT ALLOYS

(75) Inventors: Sergey D. Lopatin, Santa Clara, CA (US); Arulkumar Shanmugasundrum, Sunnyvale, CA (US); Yosef Shacham-Diamand, Ithaca, NY (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/967,101

(22) Filed: Oct. 15, 2004

(65) Prior Publication Data

US 2005/0124158 A1 Jun. 9, 2005

Related U.S. Application Data

(60) Provisional application No. 60/511,980, filed on Oct. 15, 2003.

(51) Int. Cl.
- *H01L 21/44* (2006.01)
- *C23C 28/02* (2006.01)
- *C25D 3/46* (2006.01)

(52) U.S. Cl. .................. 438/678; 438/686; 438/687; 205/185; 205/263

(58) Field of Classification Search .............. 205/185
See application file for complete search history.

(56) References Cited

U.S. PATENT DOCUMENTS

| | | |
|---|---|---|
| 4,265,943 A | 5/1941 | Goldstein et al. |
| 2,369,620 A | 2/1945 | Sullivan et al. |
| 3,403,035 A | 9/1968 | Schneble et al. |
| 3,745,039 A | 7/1973 | Feldstein et al. |
| 3,937,857 A | 2/1976 | Brummett et al. |
| 4,006,047 A | 2/1977 | Brummett et al. |
| 4,150,177 A | 4/1979 | Guditz et al. |
| 4,232,060 A | 11/1980 | Mallory, Jr. |
| 4,234,628 A | 11/1980 | DuRose |
| 4,364,803 A | 12/1982 | Nidola et al. |
| 4,368,223 A | 1/1983 | Kobayashi et al. |
| 4,397,812 A | 8/1983 | Mallory, Jr. |

(Continued)

FOREIGN PATENT DOCUMENTS

EP   0 329 406   8/1989

(Continued)

OTHER PUBLICATIONS

Partial International Search Report dated Jul. 8, 2005 regarding International Application No. PCT/US03/10073.

(Continued)

*Primary Examiner*—Ha Nguyen
*Assistant Examiner*—Cheung Lee
(74) *Attorney, Agent, or Firm*—Patterson & Sheridan LLP

(57) ABSTRACT

In one embodiment, a method for depositing a capping layer on a substrate surface containing a copper layer is provided which includes exposing the substrate surface to a zinc solution, exposing the substrate surface to a silver solution to form a silver layer thereon and depositing the capping layer on the silver layer by an electroless deposition process. A second silver layer may be formed on the capping layer, if desired. In another embodiment, a composition of a deposition solution useful for forming a cobalt tungsten alloy contains calcium tungstate, a cobalt source at a concentration within a range from about 50 mM to about 500 mM, a complexing agent at a concentration within a range from about 100 mM to about 700 mM, and a buffering agent at a concentration within a range from about 50 mM to about 500 mM.

37 Claims, 3 Drawing Sheets

U.S. PATENT DOCUMENTS

| | | | |
|---|---|---|---|
| 4,632,857 A | 12/1986 | Mallory, Jr. | |
| 4,810,520 A | 3/1989 | Wu | |
| 5,147,692 A | 9/1992 | Bengston | |
| 5,169,680 A | 12/1992 | Ting et al. | |
| 5,203,911 A | 4/1993 | Sricharoenchaikit et al. | |
| 5,235,139 A | 8/1993 | Bengston et al. | |
| 5,240,497 A | 8/1993 | Shacham et al. | |
| 5,248,527 A | 9/1993 | Uchida et al. | |
| 5,380,560 A | 1/1995 | Kaja et al. | |
| 5,384,284 A | 1/1995 | Doan et al. | |
| 5,415,890 A | 5/1995 | Kloiber et al. | |
| 5,478,462 A | 12/1995 | Walsh | |
| 5,510,216 A | 4/1996 | Calabrese et al. | |
| 5,648,125 A | 7/1997 | Cane | |
| 5,674,787 A | 10/1997 | Zhao et al. | |
| 5,695,810 A | 12/1997 | Dubin et al. | |
| 5,733,816 A | 3/1998 | Iyer et al. | |
| 5,755,859 A | 5/1998 | Brusic et al. | |
| 5,824,599 A | 10/1998 | Shacham-Diamand et al. | |
| 5,830,805 A | 11/1998 | Shacham-Diamand et al. | |
| 5,843,538 A | 12/1998 | Ehrsam et al. | |
| 5,846,598 A | 12/1998 | Semkow et al. | |
| 5,882,433 A | 3/1999 | Ueno | |
| 5,885,749 A | 3/1999 | Huggins et al. | |
| 5,891,513 A | 4/1999 | Dubin et al. | |
| 5,904,827 A | 5/1999 | Reynolds | |
| 5,907,790 A | 5/1999 | Kellam | |
| 5,910,340 A | 6/1999 | Uchida et al. | |
| 5,913,147 A | 6/1999 | Dubin et al. | |
| 5,932,077 A | 8/1999 | Reynolds | |
| 5,955,141 A * | 9/1999 | Soutar et al. | 228/209 |
| 5,969,422 A | 10/1999 | Ting et al. | |
| 6,010,962 A | 1/2000 | Liu et al. | |
| 6,015,724 A | 1/2000 | Yamazaki | |
| 6,015,747 A | 1/2000 | Lopatin et al. | |
| 6,065,424 A | 5/2000 | Shacham-Diamand et al. | |
| 6,077,780 A | 6/2000 | Dubin | |
| 6,100,184 A | 8/2000 | Zhao et al. | |
| 6,107,199 A | 8/2000 | Allen et al. | |
| 6,110,530 A | 8/2000 | Chen et al. | |
| 6,113,771 A | 9/2000 | Landau et al. | |
| 6,136,163 A | 10/2000 | Cheung et al. | |
| 6,136,693 A | 10/2000 | Chan et al. | |
| 6,140,234 A | 10/2000 | Uzoh et al. | |
| 6,144,099 A | 11/2000 | Lopatin et al. | |
| 6,153,935 A | 11/2000 | Edelstein et al. | |
| 6,165,912 A | 12/2000 | McConnell et al. | |
| 6,171,661 B1 | 1/2001 | Zheng et al. | |
| 6,174,812 B1 | 1/2001 | Hsiung et al. | |
| 6,180,523 B1 | 1/2001 | Lee et al. | |
| 6,197,181 B1 | 3/2001 | Chen | |
| 6,197,364 B1 | 3/2001 | Paunovic et al. | |
| 6,197,688 B1 | 3/2001 | Simpson | |
| 6,228,233 B1 | 5/2001 | Lakshmikanthan et al. | |
| 6,242,349 B1 | 6/2001 | Nogami et al. | |
| 6,245,670 B1 | 6/2001 | Cheung et al. | |
| 6,251,236 B1 | 6/2001 | Stevens | |
| 6,258,220 B1 | 7/2001 | Dordi et al. | |
| 6,258,223 B1 | 7/2001 | Cheung et al. | |
| 6,258,270 B1 | 7/2001 | Hilgendorff et al. | |
| 6,258,707 B1 | 7/2001 | Uzoh | |
| 6,261,637 B1 | 7/2001 | Oberle | |
| 6,291,082 B1 | 9/2001 | Lopatin | |
| 6,291,348 B1 | 9/2001 | Lopatin et al. | |
| 6,319,387 B1 | 11/2001 | Krishnamoorthy et al. | |
| 6,323,128 B1 | 11/2001 | Sambucetti et al. | |
| 6,342,733 B1 | 1/2002 | Hu et al. | |
| 6,344,410 B1 | 2/2002 | Lopatin et al. | |
| 6,403,481 B1 * | 6/2002 | Matsuda et al. | 438/687 |
| 6,416,647 B1 | 7/2002 | Dordi et al. | |
| 6,431,190 B1 | 8/2002 | Oka et al. | |
| 6,432,819 B1 | 8/2002 | Pavate et al. | |
| 6,436,267 B1 | 8/2002 | Carl et al. | |
| 6,436,816 B1 | 8/2002 | Lee et al. | |
| 6,441,492 B1 | 8/2002 | Cunningham | |
| 6,503,834 B1 | 1/2003 | Chen et al. | |
| 6,516,815 B1 | 2/2003 | Stevens et al. | |
| 6,528,409 B1 * | 3/2003 | Lopatin et al. | 438/618 |
| 6,565,729 B1 | 5/2003 | Chen et al. | |
| 6,573,606 B1 | 6/2003 | Sambucetti et al. | |
| 6,588,437 B1 | 7/2003 | Higashi | |
| 6,605,874 B1 | 8/2003 | Leu et al. | |
| 6,616,772 B1 | 9/2003 | de Larios et al. | |
| 6,616,967 B1 | 9/2003 | Test | |
| 6,645,550 B1 | 11/2003 | Cheung et al. | |
| 6,645,567 B1 | 11/2003 | Chebiam et al. | |
| 6,680,540 B1 | 1/2004 | Nakano et al. | |
| 6,717,189 B1 | 4/2004 | Inoue et al. | |
| 6,743,473 B1 | 6/2004 | Parkhe et al. | |
| 6,756,682 B1 | 6/2004 | Sinha et al. | |
| 6,787,450 B1 | 9/2004 | Sinha et al. | |
| 6,794,288 B1 | 9/2004 | Kolics et al. | |
| 6,821,909 B1 | 11/2004 | Ramanathan et al. | |
| 6,824,612 B1 | 11/2004 | Stevens et al. | |
| 6,824,666 B1 | 11/2004 | Gandikota et al. | |
| 2002/0098681 A1 | 7/2002 | Hu et al. | |
| 2002/0098711 A1 | 7/2002 | Klein | |
| 2003/0000846 A1 * | 1/2003 | Rzeznik et al. | 205/263 |
| 2003/0010645 A1 | 1/2003 | Ting et al. | |
| 2003/0075808 A1 | 4/2003 | Inoue et al. | |
| 2003/0113576 A1 | 6/2003 | Chebiam et al. | |
| 2003/0116439 A1 | 6/2003 | Seo et al. | |
| 2003/0141018 A1 | 7/2003 | Stevens et al. | |
| 2003/0181040 A1 | 9/2003 | Ivanov et al. | |
| 2003/0186535 A1 | 10/2003 | Wong et al. | |
| 2004/0035316 A1 | 2/2004 | Cheblam et al. | |
| 2004/0038073 A1 | 2/2004 | Chebiam et al. | |
| 2004/0065540 A1 | 4/2004 | Mayer et al. | |
| 2004/0096592 A1 | 5/2004 | Chebiam et al. | |
| 2004/0113277 A1 | 6/2004 | Chiras et al. | |
| 2004/0175509 A1 | 9/2004 | Kolics et al. | |
| 2004/0262772 A1 | 12/2004 | Ramanathan et al. | |
| 2005/0008788 A1 * | 1/2005 | Joshi et al. | 427/430.1 |
| 2005/0090098 A1 | 4/2005 | Dubin et al. | |
| 2005/0136185 A1 | 6/2005 | Ramanathan et al. | |

FOREIGN PATENT DOCUMENTS

| | | |
|---|---|---|
| EP | 0 475 567 | 3/1992 |
| EP | 0 913 498 | 5/1999 |
| GB | 2285174 | 6/1995 |
| JP | 7-297543 | 11/1995 |
| JP | 11-124682 | 5/1999 |
| WO | WO 88/08887 | 11/1988 |

OTHER PUBLICATIONS

Partial International Search Report dated Apr. 6, 2005 regarding International Application No. PCT/US2004/034044.

Partial International Search Report dated Apr. 6, 2005 regarding International Application No. PCT/US2004/034449.

Dubin, et al., "Selective and Blanket Electroless Copper Deposition for Ultralarge Scale Integration," J. Electrochem. Soc., vol. 144, No. 3, Mar. 1997, pp. 898-908.

Eze, et al., "Chemical-bath-deposited cobalt sulphide films: preparation effects," Materials Chemistry and Physics, 47 (1997), pp. 31-36.

Eze, F. C., "Electroless deposition of CoO thin films," J. Phys. D. Appl. Phys. 32 (1999), pp. 533-540.

Georgious, et al., "Thick Selective Electroless-Plated Cobalt-Nickel Alloy Contacts to $CoSi_2$." J. Electrochem. Soc., vol. 138, No. 7, Jul. 1991, pp. 2061-2069.

Hu, et al., "Reduced electromigration of Cu wires by surface coating," Applied Physics Letters, vol. 81, No. 10, Sep. 2002, pp. 1782-1784.

Lin, et al., "Manufacturing of Cu/Electroless Nickel/Sn-Pb Flip Chip Solder Bumps," IEEE Transactions on Advanced Packaging, vol. 22, No. 4 (Nov. 1999), pp. 575-579.

Lopatin, et al., "Thin Electroless barrier for copper films," Part of the SPIE Conference of Multilevel Interconnect technology II, SPIE vol. 3508 (1998), pp. 65-77.

Pearlstein, Fred, "Electroless Plating," J. Res. Natl. Bur. Stan., Ch. 31 (1963), pp. 710-747.

Saito, et al., "Electroless deposition of Ni-B, Co-B and Ni-Co-B alloy using dimethylamineborane as a reducing agent," J. of Appl. Electrochemistry 28 (1998), pp. 559-563.

Shacham-Diamand, et al., "Copper electroless deposition technology for ultra-large-scale-integration (ULSI) metallization," Microelectric Engineering 33 (1997), pp. 47-58.

Shacham-Diamand, et al., "Electrochemically deposited thin film alloys for ULSI and MEMS applications," Microelectronic Engineering 50 (2000), pp. 525-531.

Shacham-Diamand, et al., "Electroless copper deposition for ULSI," Thin Solid Films 262 (1995), pp. 93-103.

Shacham-Diamand, et al., "High Aspect Ratio Quarter-Micron Electroless Copper Integrated Technology," Microelectronic Engineering 37/38 (1997), pp. 77-88.

Shacham-Diamand, et al., "Integrated electrometallization for ULSI," Electrochimica Acta 44 (1999), pp. 3639-3649.

Shacham-Diamand, et al., "Material properties of electroless 100-200 nm thick CoWP films," Electrochemical Society Proceedings, vol. 99-34, pp. 102-110.

Ting, et al., "Selective Electroless Metal Deposition for Via Hole Filling in VLSI Multilevel Interconnection Structures," J. Electrochem. Soc., vol. 136, No. 2, Feb. 1989, pp. 462-465.

* cited by examiner

US 7,064,065 B2

SILVER UNDER-LAYERS FOR ELECTROLESS COBALT ALLOYS

CROSS-REFERENCE TO RELATED APPLICATIONS

This application claims benefit of U.S. Provisional Patent Application Ser. No. 60/511,980, filed Oct. 15, 2003, which is herein incorporated by reference.

BACKGROUND OF THE INVENTION

1. Field of the Invention

Embodiments of the invention generally relate to methods for activating a conductive material and depositing a capping layer on a semiconductor feature, and more particularly, at least in one embodiment, methods for depositing a silver activation layer on a copper surface for subsequent deposition of a cobalt alloy layer.

2. Description of the Related Art

Recent improvements in circuitry of ultra-large scale integration (ULSI) on substrates indicate that future generations of semiconductor devices will require smaller multi-level metallization with smaller geometric dimensions. The multilevel interconnects that lie at the heart of this technology require planarization of interconnect features formed in high aspect ratio features, including contacts, vias, lines and other features. Reliable formation of these interconnect features is very important to the success of ULSI and to the continued effort to increase circuit density and quality on individual substrates and die as features decrease in size.

Currently, copper and its alloys have become the metals of choice for sub-micron interconnect technology because copper has a lower resistivity than aluminum, (e.g., 1.67 $\mu\Omega$-cm for Cu and 3.1 $\mu\Omega$-cm for aluminum at room temperature), a higher current carrying capacity, and significantly higher electromigration resistance. These characteristics are important for supporting the higher current densities experienced at high levels of integration and increased device speed. Further, copper has a good thermal conductivity and is available in a highly pure state.

The use of copper as a conductive material poses several challenges. Copper readily migrates under current and may contaminate the dielectric material by way of diffusion. Also, copper forms copper oxide when exposed to atmospheric conditions or environments outside of processing equipment and therefore requires passivation to prevent copper oxide formation. Copper oxides increase the resistance of the copper layer, become a source of particle contamination and reduce the reliability of the overall circuit.

One solution to minimize electromigration and oxidation of copper is to deposit a capping layer on the exposed copper surface. Cobalt alloys have been observed as suitable materials for capping copper surfaces and are generally deposited by electroless deposition techniques. However, copper does not easily catalyze or initiate the deposition of materials with lower reduction potential, such as cobalt or nickel, from conventional electroless solutions. One approach to initiate cobalt alloy deposition on a copper surface is to apply a reducing current to initiate deposition through a galvanic reaction. However, one difficulty of using a reducing current to initiate cobalt alloy deposition is the availability of a continuous conductive surface over the substrate surface. A conductive surface may not be available with many applications, particularly after planarization of the copper and dielectric layers by chemical mechanical polishing (CMP) techniques.

Another approach to activate the copper surface is to deposit a catalytic material on the copper surface prior to depositing a cobalt alloy layer. However, deposition of the catalytic material may require multiple steps or use catalytic colloid compounds, such as palladium colloids. Catalytic colloid compounds may adhere on dielectric materials and result in undesired, excessive and non-selective deposition of the cobalt alloy materials on the substrate surface. Non-selective deposition of cobalt alloy materials may lead to surface contamination, unwanted diffusion of conductive materials into dielectric materials, and even device failure from short circuits and other device irregularities.

Another approach to catalyze or initiate deposition of cobalt alloys is to deposit a more electropositive metal on the copper surface. A catalytic activation layer may be deposited on the copper layer and is generally composed of a single, noble metal, such as palladium or platinum. The noble metal activation layer may be deposited on the copper layer to provide good adhesion between the copper layer and the capping layer. However, the noble metal/copper interphase, such as a palladium/copper (Pd/Cu) interphase, has a higher resistivity than copper (i.e., an increase of about 1 $\mu\Omega$-cm for 1% atomic Pd in Cu over pure Cu). The higher resistivity reduces current and is not a desirable trait. Also, noble metal deposition solutions generally require a high metal ion (e.g., $Pd^{2+}$ or $Pt^{2+}$) concentration in order to obtain deposited layers. The deposition processes utilizing palladium or platinum are usually not efficient at plating or reducing the metal ions onto the copper surface and therefore much of the expensive and unconsumed metal ions are discarded as waste when the depleted deposition solution is discarded. Furthermore, while platinum and palladium are often used as activation materials due to their high catalytic properties, platinum and palladium are often not easily deposited selectively on the conductive layer and contaminate the dielectric layer of a substrate surface.

Although cobalt alloys are deposited as capping layers to protect copper layers from destructive oxidation, cobalt alloys are susceptible to oxidation which forms metal alloyed oxides. Once the cobalt alloy is oxidized, there is a likelihood the copper underlayer may also be oxidized due to oxygen passage from the metal alloyed oxides to the copper layer. Metal oxides in the capping layer or on the copper layer are undesirable because of the increased resistivity.

Therefore, there is a need for a method to form a semiconductor feature including a capping layer with low electrical resistance, strong barrier properties and good adhesion to a conductive layer.

SUMMARY OF THE INVENTION

In one embodiment, a method for depositing a capping layer on a substrate surface containing a conductive layer, such as copper, is provided which includes exposing the substrate surface to a zinc solution to form a zinc layer on the conductive layer. The method further includes exposing the substrate surface to a silver solution to form a silver layer on the zinc layer, depositing the capping layer on the silver layer by an electroless deposition process and forming a second silver layer on the capping layer.

In another embodiment, a composition of a deposition solution to deposit a cobalt tungsten alloy is disclosed. The deposition solution includes $CaWO_4$, a cobalt source in a range from about 50 mM (millimolar) to about 500 mM, a complexing agent in a range from about 100 mM to about 700 mM and a buffering agent in a range from about 50 mM to about 500 mM.

In another embodiment, a semiconductor structure is provided which includes a conductive layer, such as copper, disposed on a substrate surface, a silver layer on the conductive layer, a cobalt alloy layer on the silver layer and a second silver layer on the cobalt alloy layer.

In another embodiment, a method for depositing a capping layer on a substrate surface containing a conductive layer, such as copper, is provided which includes exposing the substrate surface to a zinc solution to form a zinc layer on the conductive layer, exposing the zinc layer and the conductive layer to a silver solution to form a silver layer on the zinc layer and depositing the capping layer on the silver layer by an electroless deposition process.

In another embodiment, a method for depositing a capping layer on a substrate surface containing a conductive layer is provided which includes exposing the substrate surface to a silver solution to form a silver layer on the conductive layer and exposing the silver layer to a capping layer solution to deposit the capping layer on the silver layer. The capping layer solution includes $CaWO_4$, a cobalt source and a complexing agent.

In another embodiment, a method for depositing a capping layer on a substrate surface containing a conductive layer is provided which includes exposing the substrate surface to a silver solution to form a silver layer on the conductive layer, depositing the capping layer on the silver layer by an electroless deposition process, and forming a second silver layer on the capping layer.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1A:
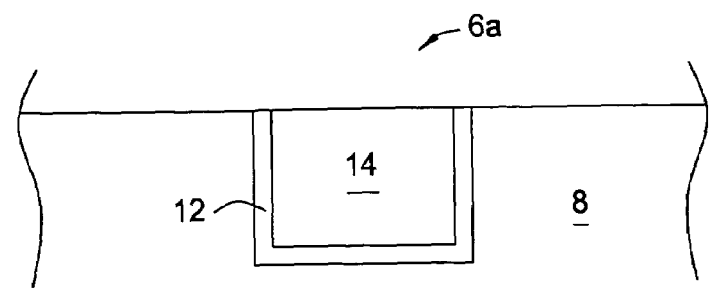
FIGS. 1A–1E show a step-wise formation of a capping layer.

The words and phrases used herein should be given their ordinary and customary meaning in the art as understood by one skilled in the art unless otherwise further defined. Electroless deposition is broadly defined herein as deposition of a conductive material by a replacement reaction or exchange reaction wherein ions in a solution replace metal atoms in a surface while the metal atoms are ionized into the solution. Also, electroless deposition is broadly defined herein as deposition of a conductive material by ions in a bath over a catalytically active surface to deposit the conductive material by chemical reduction in the absence of an external electric current, such as in an autocatalytic reaction.

Embodiments of the invention include the deposition of a silver layer as an activation material to catalyze a subsequent deposition of a capping layer, such as a cobalt alloy layer. The catalytic properties of the activation material are characteristic of the coinage or noble metals, such as silver, gold, nickel, platinum or palladium. Silver is a preferred metal for an activation layer due to a high degree of selectivity to deposit on the conductive layer. Activation layers have a tendency to become contaminated prior to deposition of the capping layer, namely by the formation of metal oxides on the surface. A second beneficial characteristic of silver over platinum or palladium as an activation material is noticeable during native oxide removal processes. Silver oxides are much easier to remove from a silver activation layer than platinum or palladium oxides from their respective metal layer. Finally, silver usage has an economical advantage over the other coinage or noble metals, since silver sources are generally less expensive than platinum or palladium sources.

The processes described herein may be performed in an apparatus suitable for performing an electroless deposition process (EDP). A suitable apparatus includes the SLIM-CELL™ processing platform that is available from Applied Materials, Inc., located in Santa Clara, Calif. The SLIM-CELL™ platform, for example, includes an integrated processing chamber capable of depositing a conductive material by an electroless process, such as an EDP cell, which is available from Applied Materials, Inc., located in Santa Clara, Calif. The SLIMCELL™ platform generally includes one or more EDP cells as well as one or more pre-deposition or post-deposition cells, such as spin-rinse-dry (SRD) cells, or annealing chambers. A further description of EDP platforms and EDP cells may be found in the commonly assigned U.S. Provisional Patent Application Ser. No. 60/511,236, entitled, "Apparatus for Electroless Deposition," filed on Oct. 15, 2003, U.S. Provisional Patent Application Ser. No. 60/539,491, entitled, "Apparatus for Electroless Deposition of Metals on Semiconductor Wafers," filed on Jan. 26, 2004, U.S. Provisional Patent Application Ser. No. 60/575,553, entitled, "Face Up Electroless Plating Cell," filed on May 28, 2004, and U.S. Provisional Patent Application Ser. No. 60/575,558, entitled, "Face Down Electroless Plating Cell," filed on May 28, 2004, which are each incorporated by reference to the extent not inconsistent with the claimed aspects and description herein.

FIG. 1A shows a cross-sectional view of an interconnect 6a containing a conductive material 14 disposed into low-k material 8. Conductive material 14 includes metals, such as copper or copper alloys. Other conductive metals, such as aluminum, tungsten, alloys thereof and combinations thereof may be used as conductive material 14. Preferably, conductive material 14 is copper or a copper alloy. Conductive material 14 is generally deposited by a deposition process, such as electroplating, electroless plating, chemical vapor deposition (CVD), atomic layer deposition (ALD), physical vapor deposition (PVD) and/or combinations thereof. As depicted in FIG. 1A, conductive material 14 may have already been through a polishing, leveling or planarization process, such as a chemical mechanical polishing (CMP) process. A barrier layer 12 separates low-k material 8 from the conductive material 14. Low-k material 8 may include features, such as electrodes or interconnects, throughout the layer (not shown). Barrier layer 12 may comprise tantalum, tantalum nitride, titanium silicon nitride, tantalum silicon nitride, titanium, titanium nitride, tungsten nitride, silicon nitride and combinations thereof. In one embodiment, barrier layer 12 includes a tantalum layer deposited on a tantalum nitride layer. Barrier layer 12 is usually deposited with deposition processes, such as, PVD, ALD, CVD or combinations thereof.

Interconnect 6a, as well as other semiconductor features, are disposed on a substrate surface. Substrates on which embodiments of the invention may be useful include, but are not limited to semiconductor wafers, such as crystalline silicon (e.g., Si<100> or Si<111>), silicon on insulator substrate, silicon oxide, silicon germanium, doped or undoped polysilicon, doped or undoped silicon wafers, silicon nitride and patterned or non-patterned wafers. Surfaces may include bare silicon wafers, films, layers and materials with dielectric, conductive or barrier properties. Substrate surface is used herein to refer to any semiconductor feature present thereon, including the exposed surfaces of the features, such as the wall and/or bottom of vias, dual damascenes, contact holes and the like.

Figure 1B:
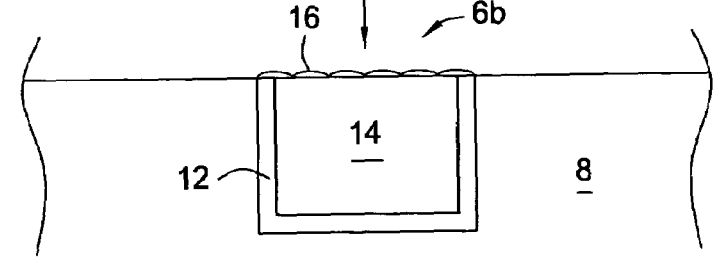
Figure 1C:
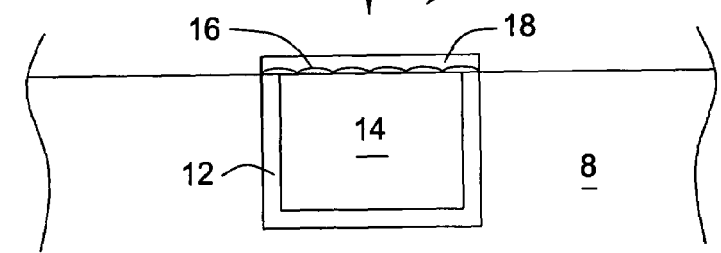
Figure 1D:
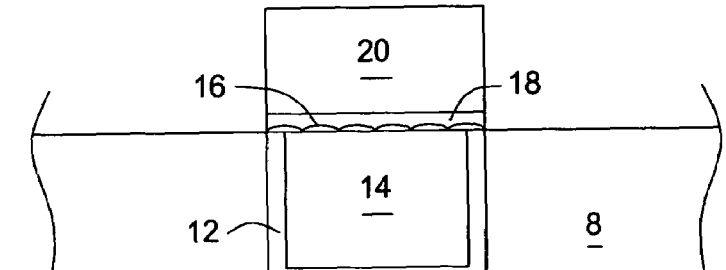
Figure 1E:
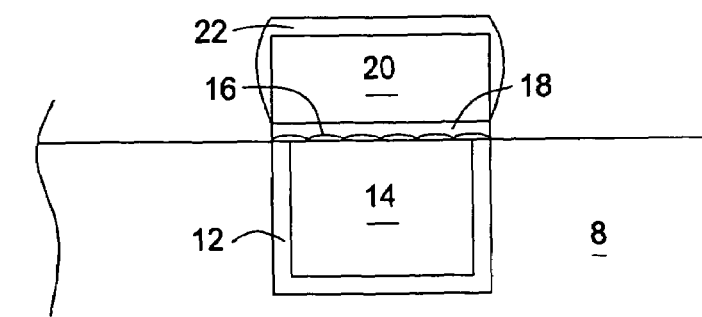
Figure 2:
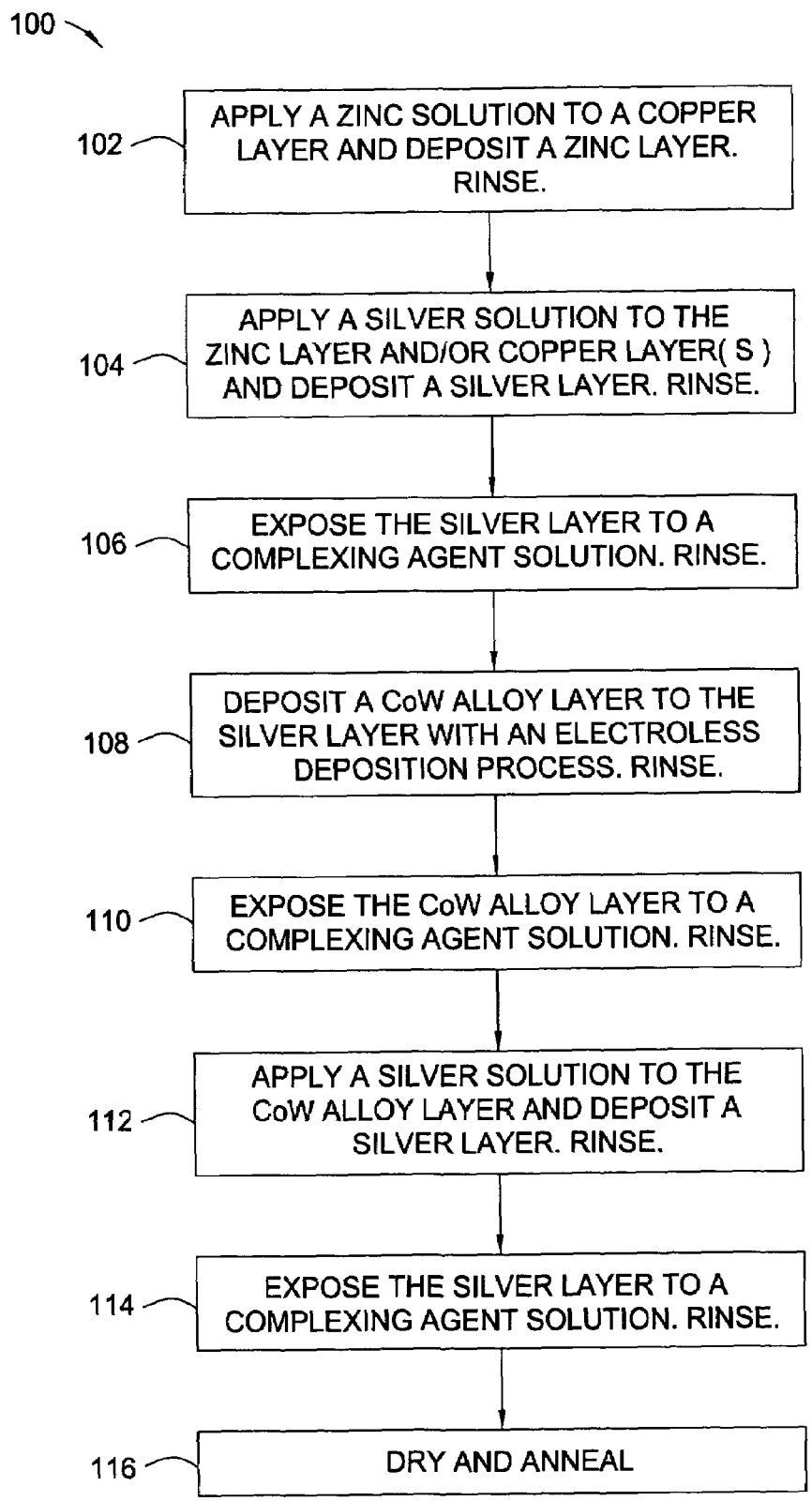
FIG. 2 is a flow chart illustrating a process to form a capping layer.

FIGS. 1A–1E depict cross-sectional views of interconnect 6 having a capping layer formed thereon according to process 100 in FIG. 2. FIG. 1B shows the zinc layer 16 deposited on the conductive material 14. The zinc layer 16 may be one continuous layer, but is generally comprised of islands of zinc across the surface of conductive material 14. The zinc layer 16 may have a thickness from about a single atomic layer to about 10 Å.

During step 102, the substrate surface is exposed to a zinc solution to form zinc layer 16. The substrate surface is exposed to the zinc solution for a period from about 1 second to about 60 seconds, preferably from about 10 seconds to about 30 seconds and more preferably for about 20 seconds. The zinc solution treats the surface by removing various contaminants from the substrate surface. Contaminants include copper-organic complexes, organic defects in the surface and other compounds commonly left over from previous processes, such as a CMP process. Zinc layer 16 forms on conductive material 14 and/or exposed portions of barrier layer 12. In one embodiment, zinc satellite islands are formed across an electronic feature comprising copper and tantalum nitride.

Generally, zinc solutions include a complexed zinc source and/or a zinc source with a complexing or chelating agent. Zinc sources found to be effective include zinc acetate, zinc chloride, zinc fluoride, zinc nitrate, zinc sulfate, zinc triflate, derivatives thereof, complexes thereof and combinations thereof. Zinc solutions may have a zinc source with a concentration from about 0.4 mM to about 25 mM, preferably from about 1 mM to about 10 mM. Complexing agents may include acetic acid, citric acid, EDTA, other carboxylic acids, salts thereof, combinations thereof and derivatives thereof.

In one example, a zinc solution includes zinc acetate dihydrate with a concentration in a range from about 0.1 g/L to about 5 g/L, tetramethylammonium hydroxide $(((CH_3)_4NOH)$, TMAH) solution (25 wt % aqueous solution) with a concentration in a range from about 5 mL/L to about 40 mL/L, preferably from about 10 mL/L to about 15 mL/L and deionized water. In another example, a zinc solution includes zinc acetate dihydrate with a concentration in a range from about 0.1 g/L to about 5 g/L, citric acid with a concentration in a range from about 5 g/L to about 40 g/L, preferably from about 10 g/L to about 15 g/L and deionized water. In another example, a zinc solution includes zinc acetate dihydrate with a concentration in a range from about 0.1 g/L to about 5 g/L, ethylenediaminetetraacetic acid (EDTA) with a concentration in a range from about 5 g/L to about 40 g/L, preferably from about 10 g/L to about 15 g/L and deionized water.

Following exposure of the substrate to the zinc solution, the substrate surface is exposed to a rinse step. The rinse step includes washing any remaining zinc solution and/or contaminants from the surface with deionized water. The substrate is rinsed for a period from about 5 seconds to about 60 seconds, preferably from about 15 seconds to about 30 seconds.

During step 104, the substrate is exposed to a silver solution to form silver layer 18, as depicted in FIG. 1C. The substrate is exposed to the silver solution for a period of time from about 1 second to about 60 seconds, preferably from about 10 seconds to about 30 seconds and more preferably for about 20 seconds. The silver layer may be a continuous or discontinuous layer with a thickness from about a single atomic layer to about 50 Å or thicker, preferably from about 3 Å to about 10 Å. Silver layer 18 forms on zinc layer 16, conductive material 14 and/or barrier layer 12 selectively, while not depositing on exposed dielectric materials. In one example, silver layer 18 is deposited over a discontinuous zinc layer 16 and exposed surfaces of conducting material 14. In another example, silver layer 18 is deposited to a continuous zinc layer. In another example, silver layer 18 displaces zinc layer 16 and is deposited on conducting material 14.

In one embodiment, the silver solution displaces at least a portion of the zinc and/or conductive material to form a silver layer on the substrate surface. Displacement is a deposition technique in which a monolayer on a surface is replaced with a monolayer of another material or element. Generally, displacement reactions are self limiting, because once a monolayer of a replacement material or element is formed, the surface of the host material or element to be displaced is not exposed to the displacement solution. In another example, the silver layer forms over zinc islands across an interconnect comprising copper and titanium nitride.

Silver solutions include a silver source and an acid. Silver sources found to be effective in embodiments of the present invention, such as step 104, include silver acetate, silver (I) chloride, silver (I) fluoride, silver (II) fluoride, silver hexafluorophosphate, silver nitrate, silver (I) oxide, silver chlorate hydrate, silver tetrafluoroborate, silver trifluoroacetate, silver pentafluoropropionate, silver sulfate, silver triflate, derivatives thereof, complexes thereof and combinations thereof. Silver solutions may have a silver source with a concentration from about 0.4 mM to about 25 mM, preferably from about 1 mM to about 10 mM. An optional complexing agent may be added to the silver solution, such as acetic acid, citric acid, EDTA, other carboxylic acids, salts thereof, and combinations thereof and derivatives thereof.

In one example, a silver solution includes silver acetate in a concentration at a range from about 0.1 g/L to about 5 g/L, sulfuric acid in a concentration at a range from about 5 mL/L to about 40 mL/L, preferably from about 10 mL/L to about 15 mL/L and deionized water. In another example, a silver solution includes silver acetate in a concentration at a range from about 0.1 g/L to about 5 g/L, hydrochloric acid (about 30% aqueous solution) in a concentration at a range from about 5 mL/L to about 40 mL/L, preferably from about 10 mL/L to about 15 mL/L and deionized water. In another example, a silver solution includes silver acetate in a concentration at a range from about 0.1 g/L to about 5 g/L, hydrofluoric acid (about 48% aqueous solution) in a concentration at a range from about 0.1 mL/L to about 10 mL/L, preferably from about 2 mL/L to about 5 mL/L and deionized water. In one example, a silver solution includes silver trifluoroacetate in a concentration at a range from about 0.1 g/L to about 5 g/L, sulfuric acid in a concentration at a range from about 5 mL/L to about 40 mL/L, preferably from about 10 mL/L to about 15 mL/L and deionized water. In another example, a silver solution includes silver trifluoroacetate in a concentration at a range from about 0.1 g/L to about 5 g/L, hydrochloric acid in a concentration at a range from about 5 mL/L to about 40 mL/L, preferably from about 10 mL/L to about 15 mL/L and deionized water. In another example, a silver solution includes silver trifluoroacetate in a concentration at a range from about 0.1 g/L to about 5 g/L, hydrofluoric acid in a concentration at a range from about 0.1 mL/L to about 10 mL/L, preferably from about 2 mL/L to about 5 mL/L and deionized water.

Following exposure of the substrate to the silver solution, the substrate surface is exposed to a rinse step. The rinse step includes washing any remaining silver solution and/or contaminants from the surface with deionized water. The substrate is rinsed for a period from about 1 second to about 30 seconds, preferably from about 5 seconds to about 10 seconds.

Silver layer 18 is exposed to a complexing agent solution during step 106. The complexing agent solution further cleans the substrate surface and removes remaining contaminants from early processes. Complexing agents are useful to chelate with metal ions, such as copper, zinc and/or silver. Generally, the substrate surface is exposed to the complexing agent solution for a period from about 5 seconds to about 60 seconds, preferably from about 15 seconds to about 30 seconds. The complexing agent solution is an aqueous solution containing a complexing agent, such as TMAH, citric acid, EDTA, carboxylic acids, salts thereof, and combinations thereof and derivatives thereof. Generally, the concentration of the complexing agent is dilute, e.g., less than 100 mM, preferably, less than 10 mM, and more preferably, less than 1 mM. In one embodiment, the complexing agent has a concentration on the complexing agent solution from about 3 μM to about 150 μM, preferably, from about 25 μM to about 100 μM.

In one example, the complexing agent solution contains TMAH in a concentration at a range from about 5 mg/L to about 50 mg/L, preferably from about 10 mg/L to about 25 mg/L. In another example, the complexing agent solution contains citric acid in a concentration at a range from about 1 mg/L to about 40 mg/L, preferably from about 5 mg/L to about 15 mg/L. In another example, the complexing agent solution contains EDTA in a concentration at a range from about 1 mg/L to about 40 mg/L, preferably from about 5 mg/L to about 15 mg/L.

Following exposure of the substrate to the complexing agent solution, the substrate surface is exposed to a rinse step. The rinse step includes washing any remaining complexing solution and/or contaminants from the surface with deionized water. The substrate is rinsed for a period from about 1 second to about 30 seconds, preferably from about 5 seconds to about 10 seconds.

A capping layer, cobalt alloy layer 20, was deposited on silver layer 18 by an electroless deposition process, as depicted in FIG. 1D. Cobalt alloy layer 20 is deposited during step 108 by exposing silver layer 18 to a cobalt alloy solution. Cobalt alloy layer 20 may include a variety of alloys containing cobalt, tungsten, molybdenum, boron, phosphorus or combinations thereof. Examples of cobalt alloys include CoW, CoWB, CoWP, CoWBP, CoMo, CoMoB, CoMoP and CoMoBP, wherein each elemental ratio varies. Generally, cobalt alloys have a composition in weight percent, such as a cobalt concentration in a range from about 85 wt % to about 95 wt %, preferably from about 88 wt % to about 90 wt %, a tungsten concentration in a range from about 1 wt % to about 6 wt %, preferably from about 2 wt % to about 4 wt %, a boron concentration in a range from about 0 wt % to about 6 wt %, preferably from about 3 wt % to about 4 wt % and a phosphorus concentration in a range from about 0 wt % to about 12 wt %, preferably from about 6 wt % to about 8 wt %.

The concentration of phosphorus and/or boron within a cobalt alloy layer can determine the degree to which the layer is amorphous. Generally, barrier properties (e.g., less diffusion of copper, oxygen or water) increase as the layer becomes more amorphous. Boron is incorporated into a cobalt alloy to add bond strength and density to the alloy. Phosphorus is incorporated into a cobalt alloy to prevent crystallization of the alloy. Therefore, each element, boron and phosphorus, has distinct attributes while simultaneously manipulating the barrier properties of a cobalt alloy layer.

Other cobalt alloys may contain other elements, such as molybdenum or calcium. When incorporated in a cobalt alloy, molybdenum or calcium has a concentration in atomic percent, such as in a range from about 0.1 at % to about 4 at %, preferably from about 2 at % to about 3 at %. Molybdenum and/or calcium can be incorporated into cobalt alloy layers to increase the density of the layer.

In step 108, a cobalt alloy solution is exposed to the silver layer 18 to deposit a cobalt alloy layer 20. Generally, the substrate is exposed to a cobalt alloy solution for a period in the range from about 5 seconds to about 90 seconds, preferably, from about 20 seconds to about 45 seconds. A cobalt alloy layer is deposited to a thickness of about 1,000 Å or less, preferably about 500 Å or less and more preferably about 150 Å or less. A cobalt alloy solution is usually maintained at a temperature in the range from about 50° C. to about 95° C. and has a pH in the range from about 7 to about 11, preferably, from about 8 to about 10, and more preferably about 9.

In one embodiment, a cobalt alloy solution is an aqueous solution (deionized water) that includes a cobalt source, a tungsten source, a complexing agent, a buffering compound, an optional phosphorus source, an optional boron source, optional antifungal or antibacterial compounds, a pH balancer, a surfactant and additives, such as accelerators and/or stabilizers.

Cobalt sources are usually in the cobalt alloy solution with a cobalt concentration in the range from about 50 mM to about 250 mM. Cobalt sources include cobalt chlorides (e.g., $CoCl_2 \cdot 6H_2O$), cobalt sulfates (e.g., $CoSO_4 \cdot 7H_2O$), derivatives thereof, complexes thereof and combinations thereof. In one example, $CoCl_2 \cdot 6H_2O$ is added to the cobalt alloy solution in a concentration at the range from about 1 g/L to about 100 g/L, preferably from about 15 g/L to about 35 g/L. In another example, $CoSO_4 \cdot 7H_2O$ is added to the cobalt alloy solution in a concentration at the range from about 1 g/L to about 100 g/L, preferably from about 15 g/L to about 35 g/L.

Tungsten sources are usually in the cobalt alloy solution with a tungsten concentration in the range from about 10 mM to about 100 mM. Tungsten sources may include calcium tungstate ($CaWO_4$), ammonium tungstate (($NH_4$)$_2WO_4$), tetramethylammonium tungstate (($Me_4N$)$_2WO_4$), tungstic acid ($H_2WO_4$) derivatives thereof and combinations thereof. Preferably, calcium tungstate is used as a tungsten source in the cobalt alloy solution. In one example, $CaWO_4$ is added to the cobalt alloy solution in a concentration at the range from about 1 g/L to about 50 g/L, preferably from about 5 g/L to about 15 g/L. In another example, $CaWO_4$ is a preferred tungsten source providing a clean source of $WO_4^{2-}$ without producing any potential $NH_3$ contaminants, as occurs during the use of ammonium tungstate. Also, calcium tungstate is a calcium source, which in some embodiments is a desired component of the cobalt alloy.

Cobalt alloys generally include elemental additives, such as phosphorus, boron and/or combinations thereof. These elemental additives are derived from cobalt alloy solutions as phosphorus sources and/or boron sources. Phosphorus sources are usually in the cobalt alloy solution in a concentration at the range from about 50 mM to about 500 mM, preferably from about 75 mM to about 225 mM. Phosphorus sources include hypophosphorous acid ($H_3PO_2$), hypophosphite salts including monobasic, dibasic or tribasic variants with cations, such as sodium, potassium, lithium, calcium, ammonium, tetramethylammonium, derivatives thereof and combinations thereof. One such phosphorus source is usually a 50% hypophosphorous acid aqueous solution. In one example, $H_3PO_2$ is in the cobalt alloy solution in a concentration at the range from about 1 g/L to about 50 g/L, preferably from about 5 g/L to about 15 g/L.

Boron sources are usually in the cobalt alloy solution in a concentration at the range from about 50 mM to about 500 mM, preferably from about 85 mM to about 260 mM. One such boron source is usually dimethylamine-borane complex (($CH_3)_2NH.BH_3$, DMAB). Other boron sources include boranes and alkylboranes such as trimethylamine borane complex (($CH_3)_3N.BH_3$) TMAB), tert-butylamine borane complex ($^tBuNH_2.BH_3$), tetrahydrofuran borane complex ($THF.BH_3$), pyridine borane complex ($C_5H_5N.BH_3$), ammonia borane complex ($NH_3.BH_3$), borane ($BH_3$), diborane ($B_2H_6$), derivatives thereof, complexes thereof and combinations thereof. In one example, DMAB is in the cobalt alloy solution in a concentration at the range from about 1 g/L to about 50 g/L, preferably from about 5 g/L to about 15 g/L.

Complexing agents may be added to the cobalt alloy solution with a concentration from about 50 mM to about 500 mM, preferably from about 150 mM to about 380 mM. Complexing agents include carboxylic acids, such as EDTA and citric acid, as well as amine compounds, such as ethylenediamine (EDA). In one example, citric acid is in the cobalt alloy solution in a concentration at the range from about 30 g/L to about 70 g/L, preferably about 50 g/L. Buffering compounds may be added to the cobalt alloy solution with a concentration from about 10 mM to about 200 mM, preferably from about 30 mM to about 80 mM. In one example, a buffering compound is boric acid ($H_3BO_3$) in a concentration at a cobalt alloy solution at a range from about 0.5 g/L to about 10 g/L, preferably from about 2 g/L to about 5 g/L. Generally, pH balancers, such as bases and acids, are added to adjust the pH of the cobalt alloy solution. Bases used to increase the pH of the cobalt alloy solution include hydroxides, amines and hydrides, such as TMAH, ammonium hydroxide ($NH_4OH$), dimethylamine (($CH_3)_2NH$), triethanolamine (($HOCH_2CH_2)_3N$, TEA), diethanolamine (($HOCH_2CH_2)_2NH$, DEA), derivatives thereof and combinations thereof. Bases are used to maintain the pH range with the preferred pH of about 9±1. In one example, $NH_4OH$ is in the cobalt alloy solution in a concentration at the range from about 5 g/L to about 100 g/L, preferably from about 20 g/L to about 25 g/L. In another example, 25% TMAH is in the cobalt alloy solution in a concentration at the range from about 5 g/L to about 100 g/L, preferably from about 20 g/L to about 25 g/L. Acids are used to decrease the pH and include hydrochloric acid, sulfuric acid, acetic acid, nitric acid, hydrofluoric acid and combinations thereof.

Antibacterial and/or antifungal compounds may be added to the cobalt alloy solution with a concentration from about 10 ppm to about 1,000 ppm, preferably about 100 ppm. For example, in one embodiment, methyl 4-hydroxy benzoic acid is in the cobalt alloy solution in a concentration at the range from about 0.1 g/L to about 1 mg/L, preferably about 0.01 g/L.

Surfactants may be added to the cobalt alloy solution with a concentration from about 10 ppm to about 1,000 ppm, preferably from about 100 ppm to about 500 ppm. The improved wettability of the silver layer 18 improves film morphology and coverage during the deposition of the cobalt alloy layer 20. The surfactant may have ionic or non-ionic characteristics. Glycol ether based surfactants (e.g., polyethylene glycol) may be used in the cobalt-containing solution, for example, surfactant containing polyoxyethylene units, such as TRITON® X-100, available from Dow Chemical Company. Other useful surfactants may contain phosphate units, for example, sodium poly(oxyethylene) phenyl ether phosphate, such as RHODAFAC® RE-610, available from Rhodia, Inc. The surfactants may be homogeneous or a heterogeneous blend containing molecules of varying length hydrocarbon chains, for example, methyl, ethyl, propyl, and/or butyl. In one example, TRITON® X-100 is in the cobalt alloy solution in a concentration at the range from about 0.005 g/L to about 0.4 g/L, preferably from about 0.02 g/L to about 0.04 g/L. In another example, RHODAFAC® RE-610 is in the cobalt alloy solution in a concentration at the range from about 0.005 g/L to about 0.4 g/L, preferably from about 0.02 g/L to about 0.04 g/L.

Additives, such as accelerators and stabilizers may be added to the cobalt alloy solution to regulate the deposition rate. Accelerators increase the deposition rate and are added to the cobalt alloy solution with a concentration from about 10 ppm to about 1,000 ppm, preferably from about 100 ppm to about 500 ppm. In one embodiment, an accelerator, aluminum sulfate hydrate ($Al_2(SO_4)_3.12H_2O$), is in the cobalt alloy solution in a concentration at the range from about 0.005 g/L to about 1 g/L, preferably from about 0.05 g/L to about 0.3 g/L. Stabilizers decrease the deposition rate and are added to the cobalt alloy solution with a concentration from about 10 ppm to about 1,000 ppm, preferably from about 100 ppm to about 500 ppm. Suitable stabilizers include calcium sulfate ($CaSO_4$), molybdenum sulfate ($Mo(SO_4)_2$) and molybdenum disulfide ($MoS_2$). In one example, calcium sulfate is in the cobalt alloy solution in a concentration at the range from about 0.005 g/L to about 1 g/L, preferably from about 0.05 g/L to about 0.3 g/L. $CaSO_4$ is also a calcium source when calcium is a desired component of the cobalt alloy. In another example, molybdenum sulfate is in the cobalt alloy solution in a concentration at the range from about 0.005 g/L to about 1 g/L, preferably from about 0.05 g/L to about 0.3 g/L. In another example, molybdenum disulfide is in the cobalt alloy solution in a concentration at the range from about 0.005 g/L to about 1 g/L, preferably from about 0.05 g/L to about 0.3 g/L. Molybdenum sulfate and molybdenum disulfide may also be used as a molybdenum source when molybdenum is a desired component of the cobalt alloy.

During step 110, the cobalt alloy layer 20 is exposed to a complexing agent solution. Various compositions of complexing agent solutions are described above in reference to step 106. The complexing agent solution further cleans the substrate surface and removes remaining contaminants from any of the earlier processes. Complexing agents are useful to chelate with metal ions, such as tungsten, cobalt, calcium, molybdenum, copper, zinc and/or silver. In one embodiment, the complexing solution used during step 110 is the same composition from the complexing solution used during step 106. However, in another embodiment, the complexing solution used during step 110 has a different composition as the complexing solution used during step 106, such as a more concentrated solution. Generally, the substrate surface is exposed to the complexing agent solution for a period from about 10 seconds to about 120 seconds, preferably from about 30 seconds to about 60 seconds.

The substrate surface is exposed to a rinse step after the deposition of the cobalt alloy layer. The rinse step includes washing any remaining cobalt alloy solution and/or contaminants from the surface with deionized water. The substrate is rinsed for a period from about 5 seconds to about 60 seconds, preferably from about 15 seconds to about 30 seconds.

During step 112, the substrate is exposed to a silver solution to form a silver layer 22 on cobalt alloy layer 20, as depicted in FIG. 1E. The exposure time of the silver solution to the substrate surface ranges from about 1 second to about 60 seconds, preferably from about 10 seconds to about 30 seconds and more preferably at about 20 seconds. The silver layer has a thickness from about a single atomic layer to about 50 Å, preferably from about 3 Å to about 10 Å. Silver layer 22 may form over the exposed surfaces of cobalt alloy layer 20 by a displacement reaction. Silver layer 22 is deposited on the top, as well as on the exposed sides of cobalt allow layer 20. Therefore, between silver layers 18 and 22, cobalt alloy layer 20 is encapsulated by silver. Furthermore, FIG. 1E illustrates an assembled interconnect 6e that includes barrier layer 12, conductive layer 14, zinc layer 16, silver layer 18, cobalt alloy layer 20 and silver layer 22.

Silver encapsulation of cobalt alloy layer 20 by silver layers 18 and 22 has several unique and useful attributes. First, a silver encapsulated barrier prevents the flow of incoming contaminants. Incoming contaminants, namely oxygen sources (e.g., $H_2O$ or $O_2$), reduce the electrical conductivity of the cobalt alloy layer by forming metal oxides with the cobalt alloy layer. The conductive layer 14 is more prone to oxygen contamination by oxygen sources or metal oxides if the integrity of the cobalt alloy layer has been compromised. Also as a barrier, silver encapsulation of cobalt alloy layer prevents the cobalt alloy from contaminating other semiconductor layer, such as dielectric layers. Second, the interphase between silver layer 18 and conductive layer 14 may have low electrical resistivity as does copper. For example, when conductive layer 14 is copper, a copper/silver (Cu/Ag) interphase exists between conductive layer 14 and silver layer 18. The resistivity of the Cu/Ag interphase increases only about 0.25 µΩ-cm for 1% atomic Ag in Cu. Therefore, a Cu/Pd interphase is about 4 times more resistive than a Cu/Ag interphase. Similarly, copper/zinc or copper/silver/zinc interphases have lower electrical resistance than does a Cu/Pd interphase. Thirdly, silver encapsulation of cobalt alloy layer 20 provides excellent adhesion to conductive layer 14 and/or zinc layer 16, as well as subsequent layers to be deposited on silver layer 22.

Following exposure of the substrate to the silver solution, the substrate surface is exposed to a rinse step. The rinse step includes washing any remaining silver solution and/or contaminants from the surface with deionized water. The substrate is rinsed for a period from about 1 second to about 30 seconds, preferably from about 5 seconds to about 10 seconds.

During step 114, the silver layer 22 is exposed to a complexing agent solution. Various compositions of complexing agent solutions are described in step 106. The complexing agent solution further cleans the substrate surface and removes remaining contaminants from any of the early processes. Complexing agents are useful to chelate with metal ions, such as tungsten, cobalt, calcium, molybdenum, copper, zinc and/or silver. In one embodiment, the complexing solution used during step 114 is the same composition from the complexing solution used during step 106. However, in another embodiment, the complexing solution used during step 114 has a different composition as the complexing solution used during step 106, such as a more concentrated solution. Generally, the substrate surface is exposed to the complexing agent solution for a period from about 10 seconds to about 120 seconds, preferably from about 30 seconds to about 60 seconds.

Following exposure of the substrate to the complexing agent solution, the substrate surface is exposed to a rinse step. The rinse step includes washing any remaining complexing solution and/or contaminants from the surface with deionized water. The substrate is rinsed for a period from about 5 seconds to about 120 seconds, preferably for about 30 seconds.

The substrate is dried and annealed during step 116. The substrate is placed into an annealing chamber and heated to a temperature in the range from about 100° C. to about 500° C., preferably from about 150° C. to about 250° C. In one embodiment, the atmosphere includes a process gas, such as $H_2$, $N_2$, Ar, forming gas and combinations thereof, preferably a 10% mixture of $H_2$ in $N_2$. The substrate is maintained in a process gas environment for a period in a range from about 5 seconds to about 60 seconds, preferably from about 10 seconds to about 15 seconds. Subsequently, in the same temperature range, the chamber is evacuated to a pressure in a range from about $10^{-7}$ Torr to about $10^{-3}$ Torr for about 1 minute and the substrate is annealed for a period in a range from about 30 seconds to about 5 minutes, preferably from about 1 minute to about 2 minutes.

Figure 3A:
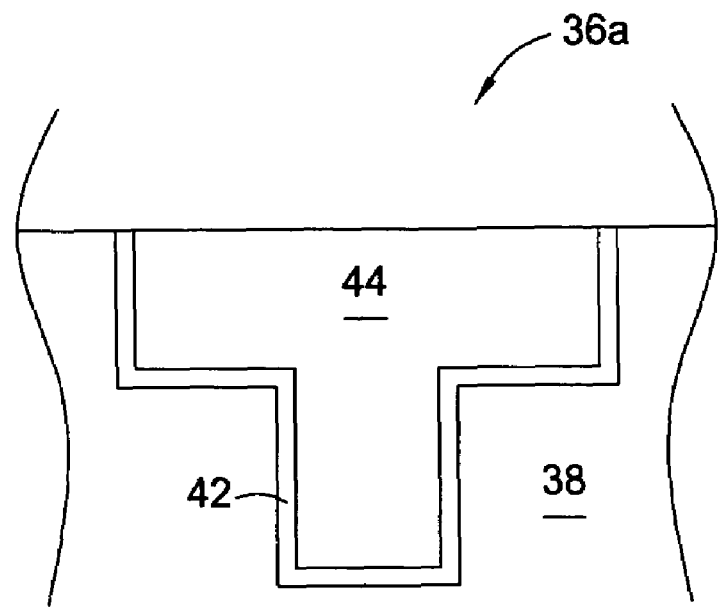
FIGS. 3A–3B show the formation of a capping layer on a dual damascene structure.

FIG. 3A shows a cross-sectional view of a dual damascene feature 36a containing a conductive material 44 disposed into a low-k material 38. Conductive material 44 includes a metal, such as copper, copper alloys, aluminum, tungsten and other alloys of the aforementioned metals. Preferably, copper is the conductive material 14. The conductive material is generally deposited by electroplating, electroless plating, CVD, ALD, PVD and combinations thereof. As depicted in FIG. 3A, conductive material 44 may have already been polished or leveled, such as by an CMP process. Generally, a barrier layer 42 separates low-k material 38 from the conductive material 44. Low-k material 38 may include features, such as electrodes or interconnects, throughout the layer (not shown). Barrier layer 42 comprises a material, such as tantalum, tantalum nitride, titanium silicon nitride, tantalum silicon nitride, titanium, titanium nitride, tungsten nitride, silicon nitride and combinations thereof. Barrier layer 42 may be deposited by an ALD, CVD or PVD technique.

Figure 3B:
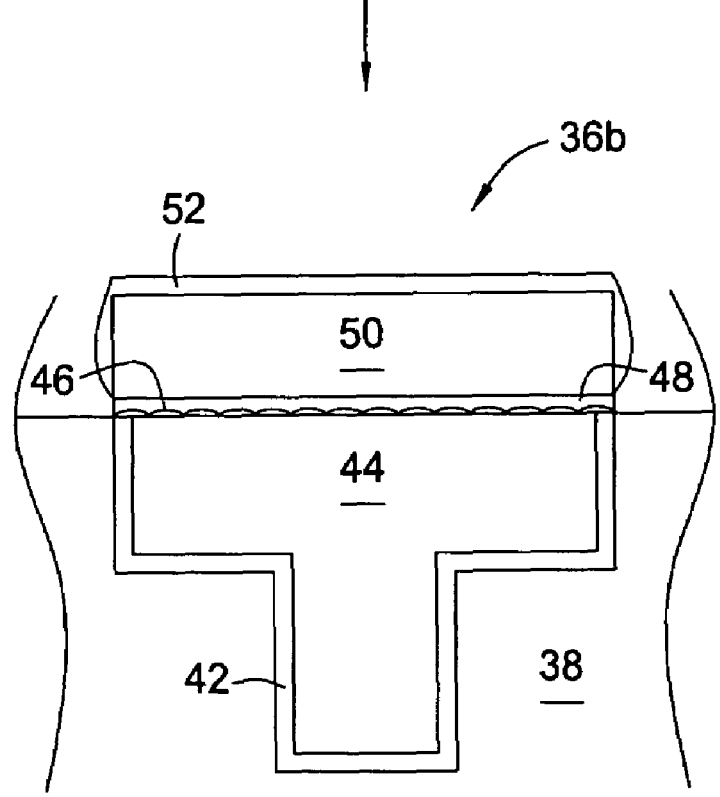

Process 100, depicted by the flow chart in FIG. 2, is followed to deposit a variety of semiconductor features, such as a capped dual damascene feature 36b as illustrated in FIG. 3B. Feature 36b includes barrier layer 42, conductive layer 44, zinc layer 46, silver layer 48, cobalt alloy layer 50 and silver layer 52.

Zinc layer 46 is deposited to conductive material 44. Zinc layer 46 may be one continuous layer, but is generally comprised of paths or islands of zinc across the surface of conductive material 44. Zinc layer 46 has a thickness from about a single atomic layer of zinc to about 10 Å.

Silver layer 48 forms on zinc layer 46, conductive material 44 and/or barrier layer 42. Silver layer 48 has a thickness from about a single atomic layer of silver to about 50 Å, preferably from about 3 Å to about 10 Å. In one embodiment, silver layer 48 is deposited over a discontinuous zinc layer 46 and exposed surfaces of conducting material 44. In another embodiment, silver layer 48 is deposited to a continuous zinc layer. In another embodiment, the silver solution displaces at least a portion of the zinc and/or conductive material to form silver layer 48. In one embodiment, the silver layer forms over zinc islands across a dual damascene structure comprising copper and titanium nitride.

Cobalt alloy layer 50 is deposited on the silver layer 48. Cobalt alloy layer 50 may include a variety of cobalt alloys containing cobalt, tungsten, molybdenum, boron, phosphorus and combinations thereof. Molybdenum and/or calcium may be incorporated into cobalt alloy layers to increase the density of the layer. Cobalt alloy layer 50 id deposited with a thickness less than 500 Å, preferably from about 50 Å to about 300 Å.

Silver layer 52 is deposited on cobalt alloy layer 50. Silver layer 52 has a thickness from about a single atomic layer of silver to about 50 Å, preferably from about 3 Å to about 10 Å. Silver layer 52 may form over the exposed surfaces of cobalt alloy layer 50 by a displacement reaction. Therefore, between silver layers 48 and 52, cobalt alloy layer 50 is encapsulated by silver.

While the foregoing is directed to embodiments of the present invention, other and further embodiments of the invention may be devised without departing from the basic scope thereof, and the scope thereof is determined by the claims that follow.

The invention claimed is:

1. A method for depositing a capping layer on a substrate surface containing a copper layer, comprising:
    exposing the substrate surface to a zinc solution during a pretreatment step;
    exposing the substrate surface to a silver solution to form a silver layer thereon;
    exposing the substrate surface to a deposition solution containing calcium tungstate to deposit a capping layer on the silver layer during a deposition process; and
    forming a second silver layer on the capping layer.

2. The method of claim 1, wherein a discontinuous zinc layer is formed during the pretreatment step.

3. The method of claim 2, wherein the zinc solution comprises a zinc source selected from the group consisting of zinc acetate, zinc chloride, zinc fluoride, zinc nitrate, zinc sulfate, zinc triflate, derivatives thereof and combinations thereof.

4. The method of claim 1, wherein the silver solution comprises a silver source selected from the group consisting of silver acetate, silver chloride, silver fluoride, silver hexafluorophosphate, silver nitrate, silver (I) oxide, silver chlorate, silver sulfate, silver triflate and combinations thereof.

5. The method of claim 1, wherein the deposition solution further contains a cobalt source, a complexing agent and a buffering agent.

6. The method of claim 5, wherein the cobalt source is at a concentration within a range from about 50 mM to about 500 mM.

7. The method of claim 6, wherein the cobalt source is selected from the group consisting of cobalt salts, cobalt chloride, cobalt sulfate, derivatives thereof and combinations thereof.

8. The method of claim 7, wherein the complexing agent is citric acid at a concentration within a range from about 100 mM to about 700 mM.

9. The method of claim 8, wherein the buffering agent is boric acid at a concentration within a range from about 50 mM to about 500 mM.

10. The method of claim 9, further comprising a phosphorus source at a concentration within a range from about 50 mM to about 500 mM.

11. The method of claim 10, wherein the phosphorus source is selected from the group consisting of hypophosphorous acid, salts thereof, derivatives thereof and combinations thereof.

12. The method of claim 11, further comprising a boron source at a concentration within a range from about 50 mM to about 500 mM.

13. The method of claim 12, wherein the boron source comprises an alkylborane.

14. The method of claim 13, further comprising an antibacterial compound or an antifungal compound.

15. A composition of a deposition solution for depositing a cobalt tungsten alloy comprising:
    calcium tungstate;
    a cobalt source at a concentration within a range from about 50 mM to about 500 mM;
    a complexing agent at a concentration within a range from about 100 mM to about 700 mM; and
    a buffering agent at a concentration within a range from about 50 mM to about 500 mM.

16. The composition of claim 15, wherein the calcium tungstate is at a concentration within a range from about 10 mM to about 100 mM.

17. The composition of claim 15, further comprising a phosphorus source.

18. The composition of claim 17, wherein the phosphorus source is at a concentration within a range from about 50 mM to about 500 mM.

19. The composition of claim 18, wherein the phosphorus source is selected from the group consisting of hypophosphorous acid, salts thereof, derivatives thereof and combinations thereof.

20. The composition of claim 19, further comprising a base at a concentration to maintain a pH value of the deposition solution within a range from about 8 to about 10.

21. The composition of claim 20, wherein the base is selected from the group consisting of ammonium hydroxide, tetramethylammonium hydroxide, dimethylamine, triethanolamine, diethanolamine, derivatives thereof and combinations thereof.

22. The composition of claim 15, further comprising a boron source.

23. The composition of claim 22, wherein the boron source is at a concentration within a range from about 50 mM to about 500 mM.

24. The composition of claim 23, wherein the boron source comprises an alkylborane.

25. The composition of claim 24, wherein the boron source is DMAB.

26. The composition of claim 15, wherein the cobalt source is selected from the group consisting of cobalt salts, cobalt chloride, cobalt sulfate, derivatives thereof and combinations thereof.

27. The composition of claim 15, wherein the complexing agent is citric acid.

28. The composition of claim 27, wherein the buffering agent is boric acid.

29. The composition of claim 15, further comprising an antibacterial compound or an antifungal compound.

30. A method for depositing a capping layer on a substrate surface containing a copper layer, comprising:
- exposing the substrate surface to a zinc solution;
- exposing the substrate surface and the copper layer to a silver solution to form a silver layer on the copper layer; and
- depositing the capping layer on the silver layer during a deposition process comprising exposing the substrate surface to a deposition solution containing calcium tungstate.

31. A method for depositing a capping layer on a substrate surface containing a copper layer, comprising:
- exposing the substrate surface to a silver solution to form a silver layer on the copper layer; and
- exposing the silver layer to a capping layer solution to deposit the capping layer on the silver layer, wherein the capping layer solution comprises calcium tungstate, a cobalt source and a complexing agent.

32. A method for depositing a capping layer on a substrate surface containing a copper layer, comprising:
- exposing the substrate surface to a silver solution to form a silver layer on the copper layer;
- exposing the substrate surface to a deposition solution containing calcium tungstate to deposit the capping layer on the silver layer; and
- forming a second silver layer on the capping layer.

33. A composition of a deposition solution for depositing a cobalt tungsten alloy comprising a calcium tungstate, a cobalt source, a complexing agent and at least one source compound selected from the group consisting of a phosphorus source, a boron source and a combination thereof.

34. The composition of claim 33, further comprising:
- a concentration of the calcium tungstate within a range from about 10 mM to about 100 mM;
- a concentration of the cobalt source within a range from about 50 mM to about 500 mM;
- a concentration of the complexing agent within a range from about 100 mM to about 700 mM; and
- a concentration of the at least one source compound within a range from about 50 mM to about 500 mM.

35. The composition of claim 34, wherein the phosphorus source is selected from the group consisting of hypophosphorous acid, salts thereof, derivatives thereof and combinations thereof, the boron source contains an alkylborane, the complexing agent is citric acid or a citrate salt.

36. The composition of claim 33, further comprising a base at a concentration to maintain the deposition solution having a pH value within a range of from about 8 to about 10.

37. The composition of claim 36, further comprising boric acid at a concentration within a range from about 50 mM to about 500 mM.

* * * * *

UNITED STATES PATENT AND TRADEMARK OFFICE
CERTIFICATE OF CORRECTION

PATENT NO.         : 7,064,065 B2                                                Page 1 of 1
APPLICATION NO. : 10/967101
DATED              : June 20, 2006
INVENTOR(S)        : Sergey D. Lopatin, Aruikumar Shanmugasundrum and Yosef Shacham-Diamand It is certified that error appears in the above-identified patent and that said Letters Patent is hereby corrected as shown below:

<u>In the Specification</u>

Column 11, Line 30: Change "allow" to --alloy--

Column 13, Line 20: Change "id" to --is--

Signed and Sealed this

Third Day of October, 2006

JON W. DUDAS
*Director of the United States Patent and Trademark Office*